United States Patent
Uchida

(10) Patent No.: US 6,870,284 B2
(45) Date of Patent: Mar. 22, 2005

(54) LINEAR MOTOR AND STAGE APPARATUS, EXPOSURE APPARATUS, AND DEVICE MANUFACTURING METHOD USING THE SAME

(75) Inventor: Shinji Uchida, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 219 days.

(21) Appl. No.: 10/079,846

(22) Filed: Feb. 22, 2002

(65) Prior Publication Data

US 2002/0117903 A1 Aug. 29, 2002

(30) Foreign Application Priority Data

Feb. 23, 2001 (JP) .......................................... 2001-047527
Feb. 5, 2002 (JP) .......................................... 2002-028330

(51) Int. Cl.$^7$ .............................................. H02K 41/00
(52) U.S. Cl. .............................................. 310/12; 310/12
(58) Field of Search ........................................ 310/12, 13

(56) References Cited

U.S. PATENT DOCUMENTS 6,025,658 A * 2/2000 Kamata ........................ 310/12

* cited by examiner

*Primary Examiner*—Nicholas Ponomarenko
*Assistant Examiner*—Iraj A. Mohandesi
(74) *Attorney, Agent, or Firm*—Fitzpatrick, Cella, Harper & Scinto

(57) ABSTRACT

A linear motor includes a magnet array having a plurality of first magnets arrayed such that polarization directions thereof are periodically opposite, and a plurality of second magnets arrayed such that polarization directions thereof are periodically opposite and intersect those of the first magnets. The linear motor further includes an electromagnetic coil disposed to oppose the magnet array to generate a Lorentz force in cooperation with the magnet array and a yoke integrated with the coil at a first side opposite to a second side of the coil disposed opposite to the magnet array.

11 Claims, 12 Drawing Sheets

F I G. 4
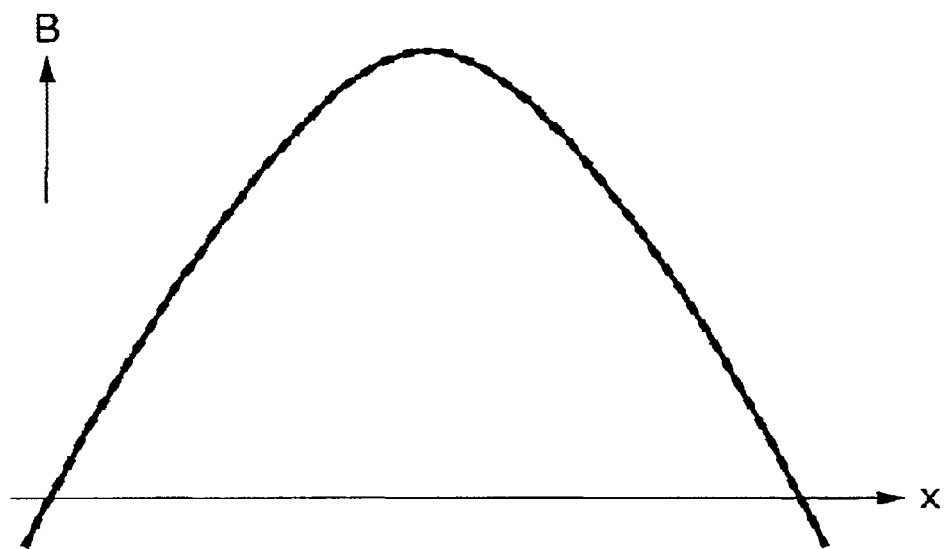

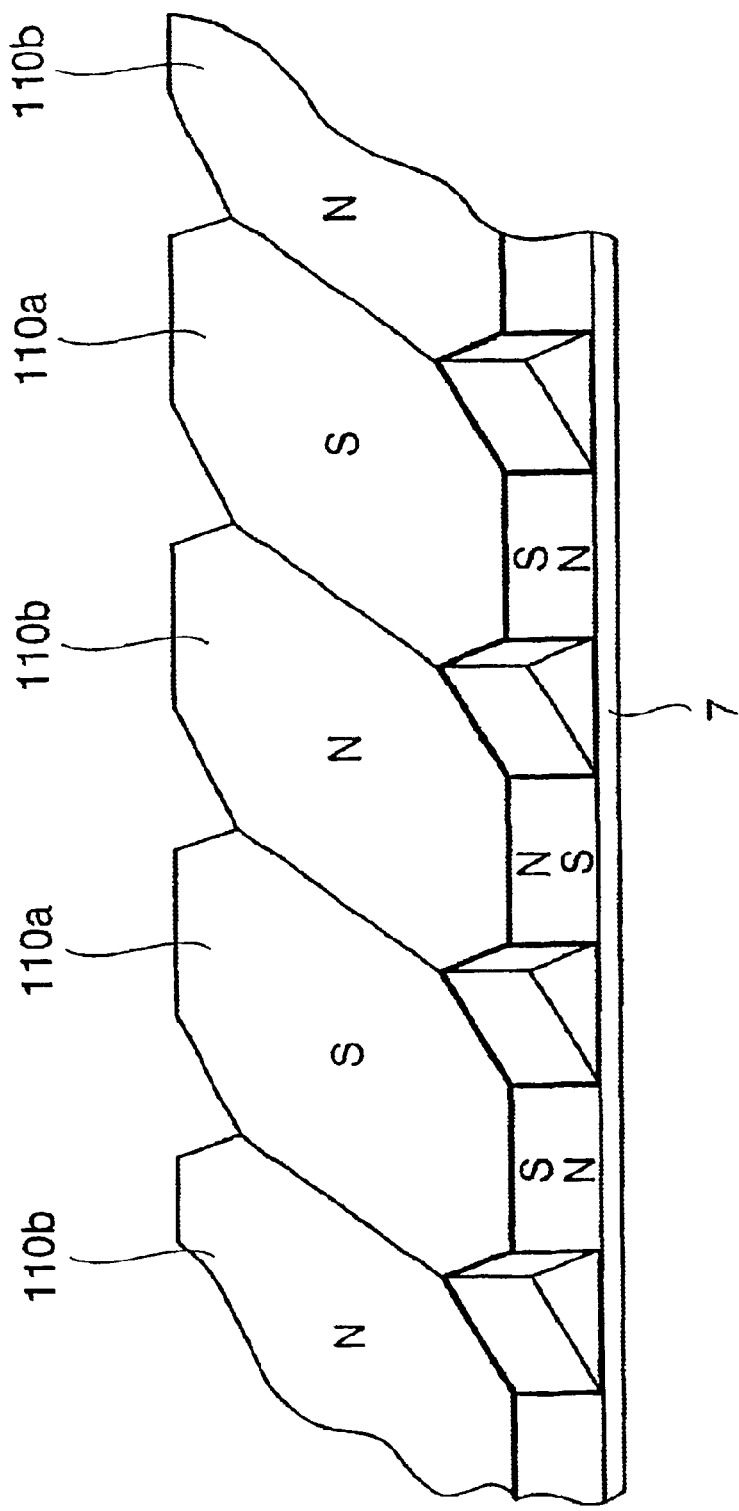

LINEAR MOTOR AND STAGE APPARATUS, EXPOSURE APPARATUS, AND DEVICE MANUFACTURING METHOD USING THE SAME

FIELD OF THE INVENTION

The present invention relates to a linear motor suitably used as, e.g., a driving source for a stage apparatus mounted on an exposure apparatus or the like for the manufacture of a semiconductor device or the like, and a stage apparatus, an exposure apparatus, and a device manufacturing method using the same.

BACKGROUND OF THE INVENTION

FIG. 12 shows the arrangement of the permanent magnets of a linear motor according to one prior art device. FIG. 12 shows only one of two permanent magnet groups opposing each other through a holding member 7. Permanent magnets 110a and 110b alternately arrayed on the holding member 7 have a non-rectangular parallelepiped shape with corners being cut off. The permanent magnets 110a and 110b are arrayed such that their magnetisms (N and S poles) are alternately opposite. Also, the thicknesses and widths of the permanent magnets 110a and 110b are so adjusted as to generate an ideal sine wave magnetic field in a space between opposing yokes and the permanent magnet groups.

According to the above prior art arrangement, to make the sine wave magnetic field generate an ideal sine wave, the thicknesses and widths of the permanent magnets must locally differ. As the entire shape of each magnet is not a simple rectangular parallelepiped, each permanent magnet is difficult to fabricate with high precision, leading to a high cost. This problem has not been solved yet. The obtained magnetic field density is lower than that obtained with a rectangular parallelepiped permanent magnet, and the driving force of the linear motor is accordingly decreased.

SUMMARY OF THE INVENTION

The present invention has been made in view of the problems of the prior art that have not yet been solved, and has as its object to provide a linear motor which has an excellent driving performance with a small thrust ripple (thrust variations) while requiring a low cost and providing a high driving force, and which can accordingly largely contribute to an increase in positioning precision and productivity of a stage apparatus for holding a substrate, e.g., a wafer, of an exposure apparatus, and a stage apparatus, exposure apparatus, and device manufacturing method using the same.

In order to achieve the above object, a linear motor according to the present invention comprises first magnets arrayed such that polarization directions thereof are periodically opposite, second magnets arrayed adjacent to the first magnets such that polarization directions thereof are periodically opposite, and an electromagnetic coil opposing the first and second magnets to generate the Lorentz force by at least the first and second magnets, the second magnets being disposed such that the polarization directions thereof intersect those of the first magnets.

Preferably, the polarization directions of the second magnets intersect those of the first magnets at an angle of substantially 90°.

Preferably, the first and second magnets are rectangular parallelepiped permanent magnets.

Preferably, the electromagnetic coil comprises at least two electromagnetic coils disposed to oppose the first and second magnets and to be energized simultaneously.

Preferably, the first and second magnets are permanent magnets with the same shape.

Preferably, either on of the first and second magnets, which is disposed at a terminal end, has a volume less than those of the other magnets.

Preferably, the first and second magnets generate a sine wave magnetic field.

According to the present invention, in a linear motor that generates a sine wave magnetic field with magnetic groups in which the polarization directions of a plurality of magnets are alternately inverted, in order to obtain an ideal sine wave magnetic field, magnets are disposed between two magnets with opposite polarization directions, such that their polarization directions intersect those of the two magnets at an angle of, e.g., substantially 90°.

An ideal sine wave magnetic field can be formed by only arraying permanent magnets with the same rectangular parallelepiped shapes while changing their polarization directions.

When compared to generating an ideal sine wave magnetic field by arraying magnets with opposite polarization directions adjacent to each other while locally machining the respective magnets to have different shapes, a linear motor with a larger driving force can be manufactured without requiring complicated machining and accordingly at a lower cost.

In this manner, when a high-performance stage apparatus having a low-cost linear motor with a large driving force and small thrust ripple as a driving unit is used as a wafer stage or the like in an exposure apparatus, a high-performance exposure apparatus with high positioning precision and excellent productivity for a semiconductor device and the like can be realized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is a graph showing the magnetic flux density at the center of the linear motor movable element shown in FIG. 3;

FIG. 12 is a partial perspective view showing a linear motor stator according to the prior art.

DETAILED DESCRIPTION OF THE PREFERRED EMBODIMENTS

The preferred embodiments of the present invention will be described with reference to the accompanying drawings.

Figure 1:
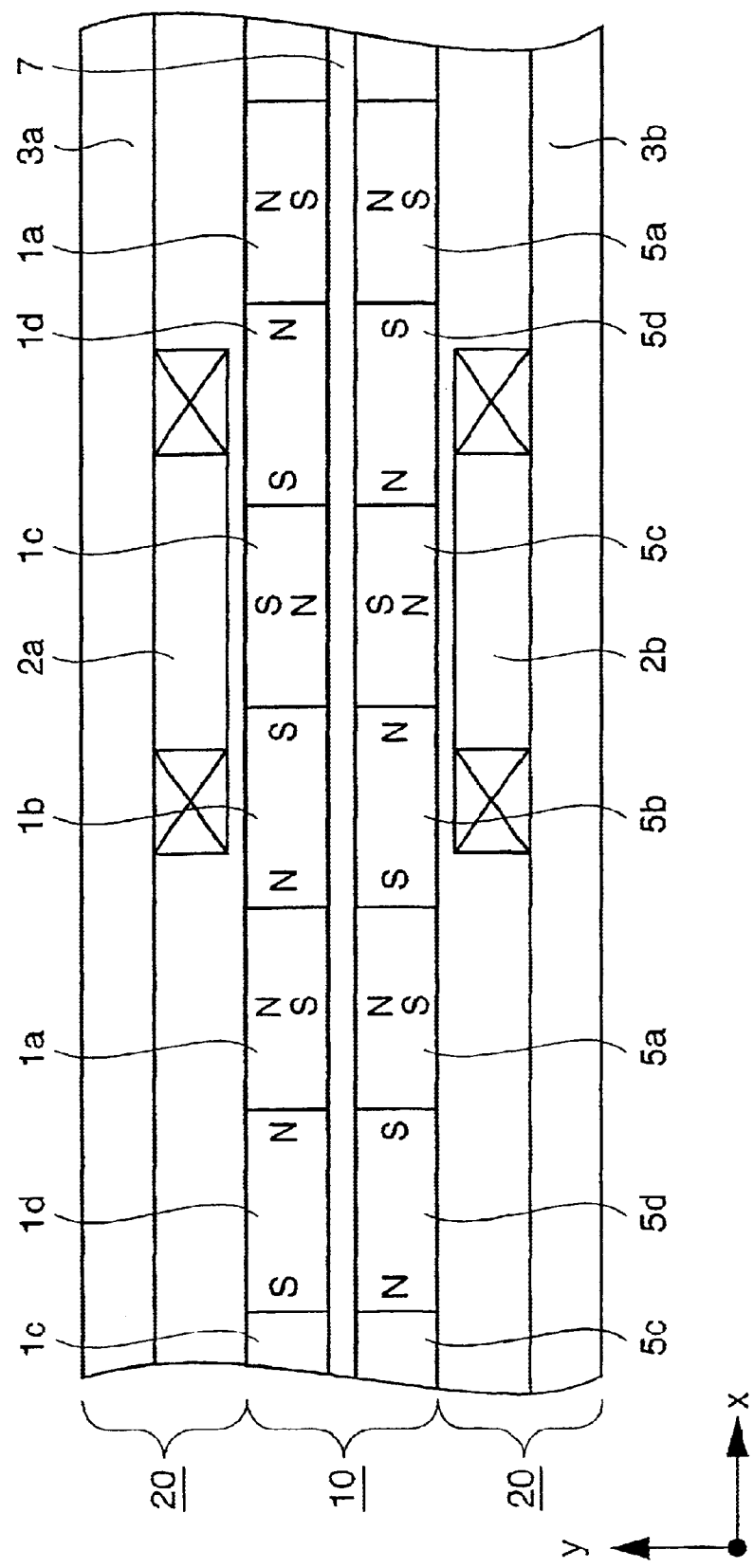
FIG. 1 is a schematic view showing the main part of a linear motor according to an embodiment of the present invention.

FIG. 1 shows an embodiment of the invention. In this linear motor M, a first permanent magnet group of first magnets 1a to 1d are arrayed in the x-axis direction and integrally connected on a holding member 7. The first permanent magnet group has the first magnets 1a and 1c arrayed such that their polarization directions are periodically opposite, and the second magnets 1b and 1d arrayed adjacent to the first magnets 1a and 1c such that their polarization directions are periodically opposite. A second permanent magnet group is arrayed on the other side of the holding member 7. A linear motor movable element 10 is thus formed. In the same manner as the first permanent magnet group, the second permanent magnet group has third magnets 5a and 5c arrayed such that their polarization directions are periodically opposite, and fourth magnets 5b and 5d arrayed adjacent to the third magnets 5a and 5c such that their polarization directions are periodically opposite.

The first magnets 1a and 1c and the third magnets 5a and 5c are arrayed such that they have the same polarization direction. The second magnets 1b and 1d and the fourth magnets 5b and 5d are arrayed such that they have opposite polarization directions.

One electromagnetic coil 2a is fixed on a yoke 3a, and the other electromagnetic coil 2b is fixed on a yoke 3b. The electromagnetic coils 2a and 2b opposing the linear motor movable element 10 make up a linear motor stator 20. When a current is supplied to the linear motor stator 20, a thrust in the x-axis direction is generated between the linear motor stator 20 and linear motor movable element 10. Alternatively, the group of first magnets 1a to 1d may form the stator of the linear motor, and the electromagnetic coils 2a and 2b may form the movable element of the linear motor. The holding member 7 may be formed of either a magnetic or nonmagnetic material.

Both the first group of permanent magnets 1a to 1d and the second group of permanent magnets 5a to 5d are integrally connected while rotating the polarization directions (the direction of a straight line that connects the N and S poles with a smallest distance from the N pole toward the S pole in each magnet) of adjacent magnets sequentially (in one direction) through 90°. The second permanent magnets 1b and 1d between the first permanent magnets 1a and 1c with the opposite polarization directions, and the fourth permanent magnets 5b and 5d between the third permanent magnets 5a and 5c have polarization directions that intersect the polarization directions of the first permanent magnets 1a and 1c and those of the third permanent magnets 5a and 5c, respectively, at an angle of substantially 90°. The yokes 3a and 3b are fixed to be immobile relatively. Stationary magnetic fields are generated respectively in a space between the first and second permanent magnets 1a to 1d and the yoke 3a, and a space between the third and fourth permanent magnets 5a to 5d and the yoke 3b.

Figure 2:
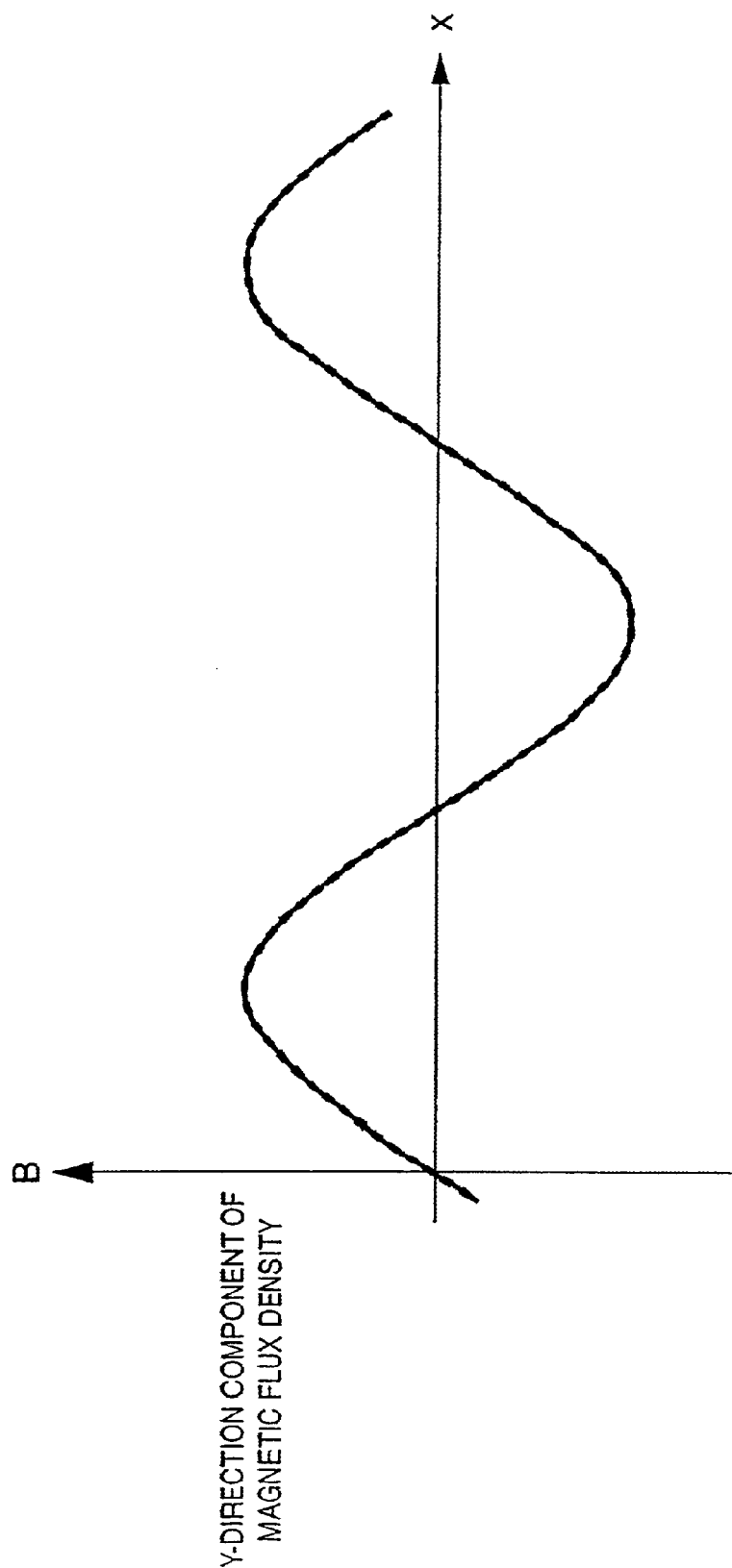
FIG. 2 is a graph showing the magnetic flux density of the linear motor movable element shown in FIG. 1.

When at least four permanent magnets with polarization directions shifted from each other by substantially 90° are provided, as described above, the y component of the magnetic field present between the permanent magnets and yoke can have a sine waveform with respect to the x-axis direction. FIG. 2 shows the y component of the magnetic flux density of this magnetic field.

Figure 3:
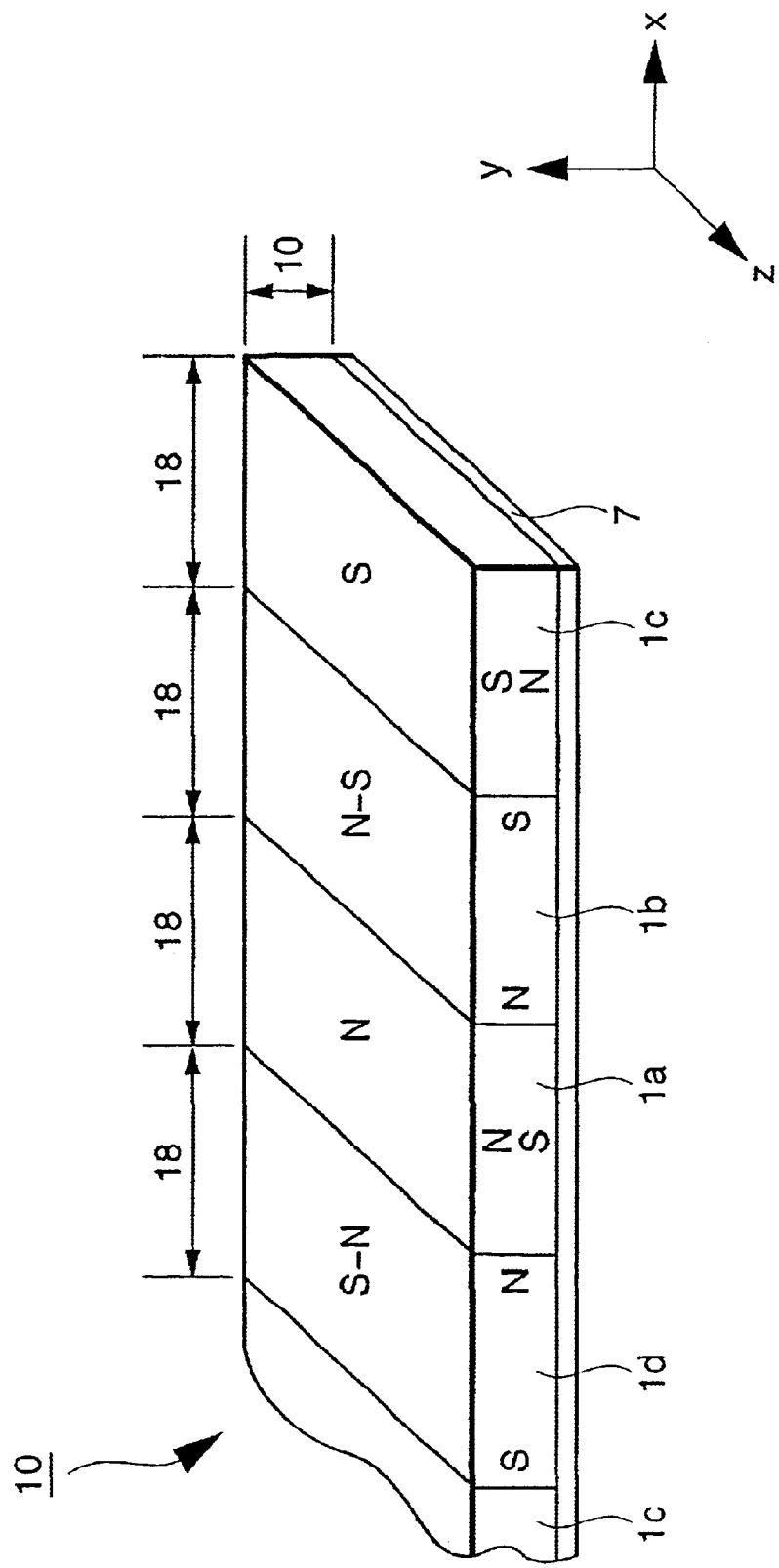
FIG. 3 is a partial perspective view showing a practical example of the linear motor movable element.

FIG. 3 shows a practical example of the first permanent magnets 1a to 1d. Regarding the length in the moving direction (x-axis direction) of the linear motor movable element 10, each of the first permanent magnets 1a and 1c, the magnetic polarity of which is in the x-axis direction, has a length of 18 mm, and each of the second permanent magnets 1b and 1d, the magnetic polarity of which is in the y-axis direction perpendicular to the x-axis direction, has a length of 18 mm. While all the magnets have a rectangular parallelepiped shape with the same size, they may have a non-rectangular parallelepiped shape. The thickness (y-axis direction) of each of the permanent magnets 1a to 1d is 10 mm, and the width (z-axis direction) thereof is 80 mm.

When a current is supplied to the electromagnetic coils 2a and 2b located in the sine wave magnetic fields of the linear motor M, the Lorentz force is generated between the permanent magnets 1a to 1d and the electromagnetic coils 2a and 2b, and the linear motor movable element 10 moves in the x-axis direction with respect to the linear motor stator 20.

FIG. 1 shows the electromagnetic coils 2a and 2b schematically. In fact, the electromagnetic coils 2a and 2b are multi-phase coils each formed by arranging a plurality of coils at a predetermined interval in the x-axis direction. Hence, the current is supplied to a plurality of electromagnetic coils simultaneously, which is multi-phase energization.

As an example of multi-phase energization, energization to two-phase coils will be considered. Assuming that the first coil is at one point (position x) in a sine wave magnetic field, when a constant current is supplied to this coil, the thrust forms a sine wave with respect to the position x of the coil. If the current is I1 (constant value), this thrust can be expressed as:

$$F1(x)=K \cdot B \cdot I1 \cdot \sin(2\pi x/a)$$

where K is a constant determined by the coil, B is the amplitude of the magnetic flux density, and $a$ is the wavelength of the sine wave.

Assume that the second coil is present at a position always at a constant distance of a/4 in the x direction from the first coil and is integrated with the first coil. When a constant current is supplied to the second coil, the thrust forms a sine wave. If the current is I2 (constant value), this thrust can be expressed as:

$$F2(x)=K \cdot B \cdot I2 \cdot \sin(2\pi(x+a/4)/a) = K \cdot B \cdot I2 \cdot \cos(2\pi x/a)$$

by using the position x of the first coil.

When a current is supplied to the two-phase coils, that is, the first and second coils, simultaneously, the total thrust is:

$$F=F1+F2 = K \cdot B(I1 \cdot \sin(2\pi x/a)+(I2 \cdot \cos(2\pi x/a)).$$

When currents satisfying $$I1=I \cdot \sin(2\pi x/a)$$

$$I2=I \cdot \cos(2\pi x/a)$$

(for I is a constant value) in correspondence to the position x of the first coil are supplied to the first and second coils, $$F = K \cdot B \cdot I$$

is obtained.

Since the coils opposing the permanent magnets $1a$ to $1d$ are the electromagnetic coils $2a$ and $2b$, the thrust is:

$$F = 2 \cdot K \cdot B \cdot I.$$

In this manner, in an ideal sine wave magnetic field, when the multi-phase coils are energized, the thrust ripple decreases. In other words, the very much smaller the error of the magnetic field is with respect to the sine wave, the very much smaller the ripple can be decreased in the total thrust.

In this manner, when a current is supplied to multi-phase coils placed in a sine wave magnetic field or an approximately sine wave magnetic field, the thrust becomes constant or almost constant, so an excellent linear motor with a small thrust ripple can be obtained.

When the permanent magnet group of FIG. 3 is used, the y component of the magnetic field present in the space between the permanent magnets and the yoke becomes close to an ideal sine wave, and an error with respect to an ideal sine wave can be set to 2% or less of the amplitude of the sine wave. FIG. 4 shows the ½-period wave of the y component. The broken line indicates an ideal sine wave, and the solid line indicates the wave of a magnetic flux density obtained with the permanent magnet group of FIG. 3. The two waves almost coincide with each other.

Because a sine wave magnetic field can be generated in the space where the coil is present, the space between the permanent magnets and the yoke can be effectively utilized, and the magnetic flux density can be increased. Consequently, the thrust of the linear motor can be increased.

When a sine wave current is supplied to the multi-phase coils, the thrust ripple of the linear motor can be decreased. Hence, the thrust characteristics of the linear motor and the positioning characteristics of a stage apparatus using this linear motor can be greatly improved.

Figure 5:
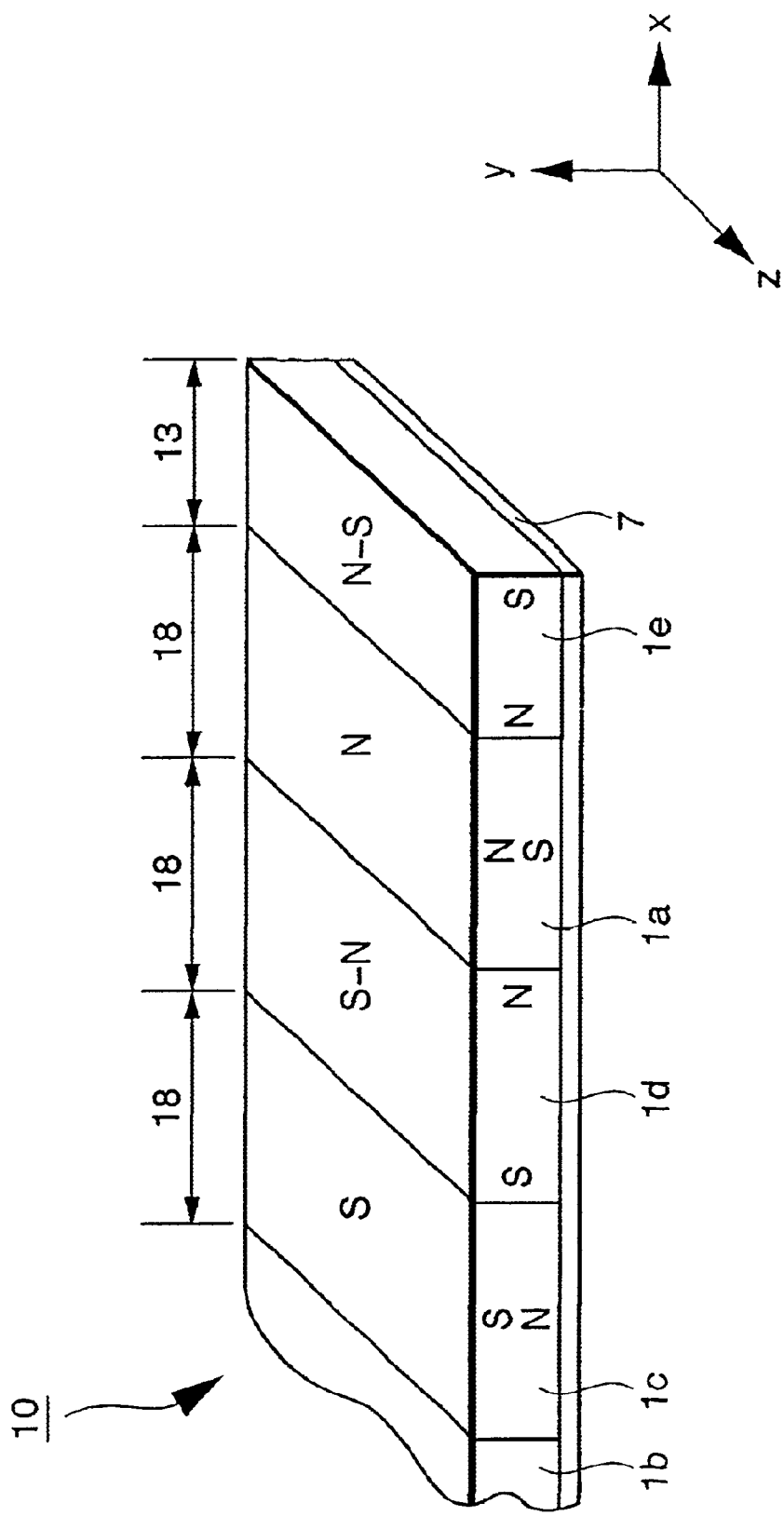
FIG. 5 is a partial perspective view showing the first modification.

FIG. 5 shows a linear motor according to the first modification. As a permanent magnet $1e$ located at the terminal end of the permanent magnet group, this linear motor uses a rectangular parallelepiped magnet with a smaller size in the x-axis direction and a smaller volume than those of the remaining permanent magnets $1a$ to $1d$. In this manner, when the size in the x-axis direction of the permanent magnet $1e$ at the terminal end is decreased to be smaller than those of the remaining permanent magnets, i.e., 13 mm, the y component of the magnetic flux density generated by the permanent magnet group becomes close to an ideal sine wave. For example, even at the terminal end of the linear motor movable element 10, an error with respect to the ideal sine wave can be decreased to 5% or less of the amplitude of the sine wave.

Figure 6:
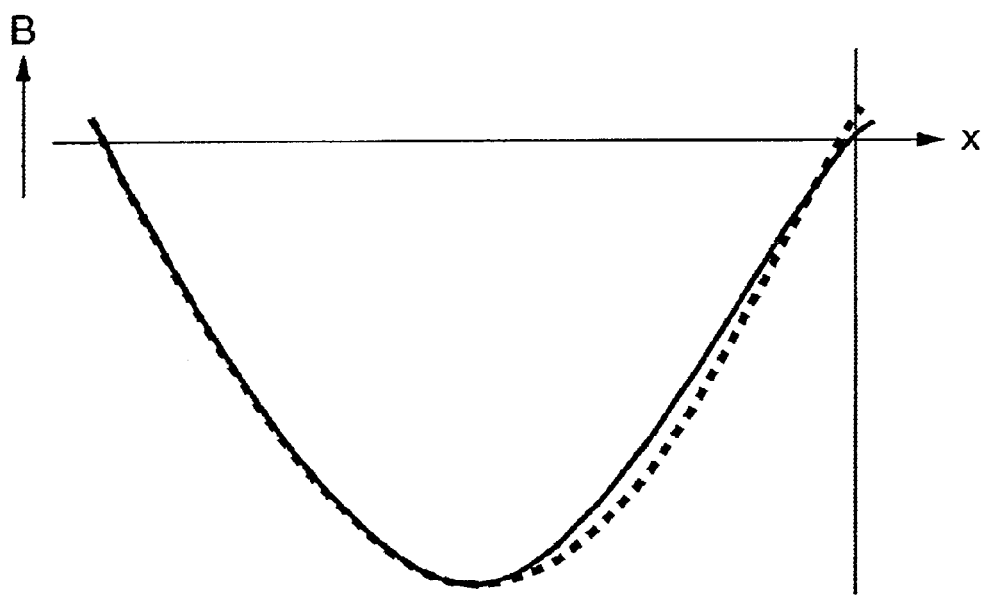
FIG. 6 is a graph showing the magnetic flux density at the terminal end of the linear motor movable element shown in FIG. 5.

FIG. 6 shows the ½-period wave of the y component at this terminal end. In FIG. 6, the right side (+x side) is the terminal end. The broken line indicates an ideal sine wave, and the solid line indicates the magnetic flux density obtained with the permanent magnet group of FIG. 5. The two waves almost coincide with each other.

Figure 7:
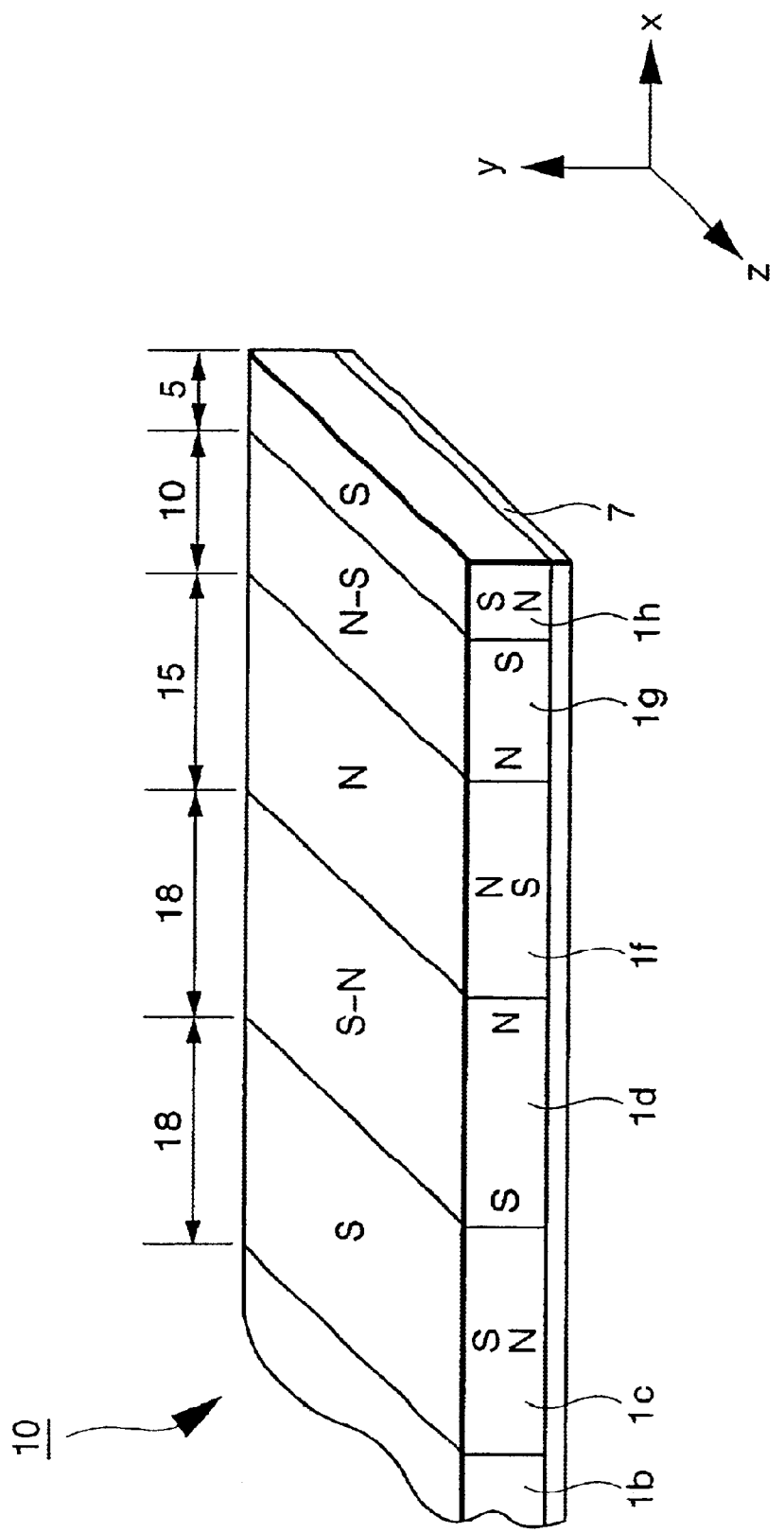
FIG. 7 is a partial perspective view showing the second modification.

FIG. 7 shows the second modification. Three permanent magnets $1f$ to $1h$ located at the terminal end side have smaller sizes in the x-axis direction and smaller volumes than those of the remaining permanent magnets $1a$ to $1d$. When the sizes in the x-axis direction of the permanent magnets $1f$ to $1h$ at the terminal end are gradually decreased, i.e., 15 mm for the permanent magnet $1f$, 10 mm for the permanent magnet $1g$, and 5 mm for the permanent magnet $1h$, the y component of the magnetic flux density generated by this permanent magnet group becomes very close to a sine wave. For example, even at the terminal end of the linear motor movable element 10, the error with respect to the ideal sine wave can be decreased to be as small as 2% or less of the amplitude of the sine wave.

Figure 8:
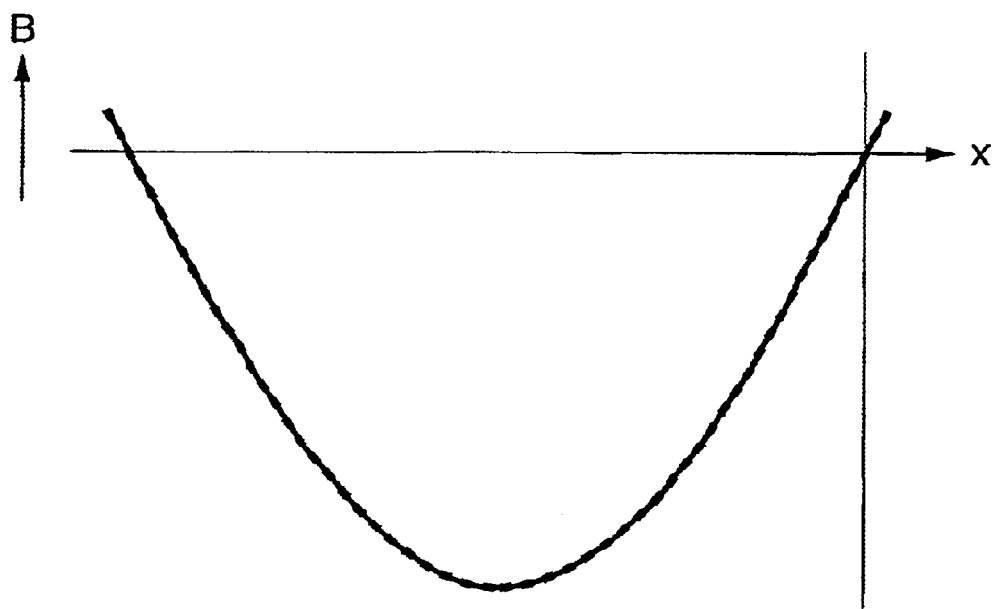
FIG. 8 is a graph showing the magnetic flux density at the terminal end of the linear motor movable element shown in FIG. 7.

FIG. 8 shows the ½-period wave of the y component at this terminal end. The right side (+x direction) is the terminal end. The broken line indicates an ideal sine wave, and the solid line indicates the magnetic flux density obtained with the permanent magnet group of FIG. 7. The two waves almost coincide with each other.

In this manner, when one or more permanent magnets each with a small volume are arranged at the terminal end, a magnetic flux density distribution close to an ideal sine wave can be maintained even at the terminal end of the permanent magnet group. Thus, an excellent linear motor with a small thrust ripple until the terminal end, i.e., a small thrust ripple over a long stroke, can be provided.

Figure 9:
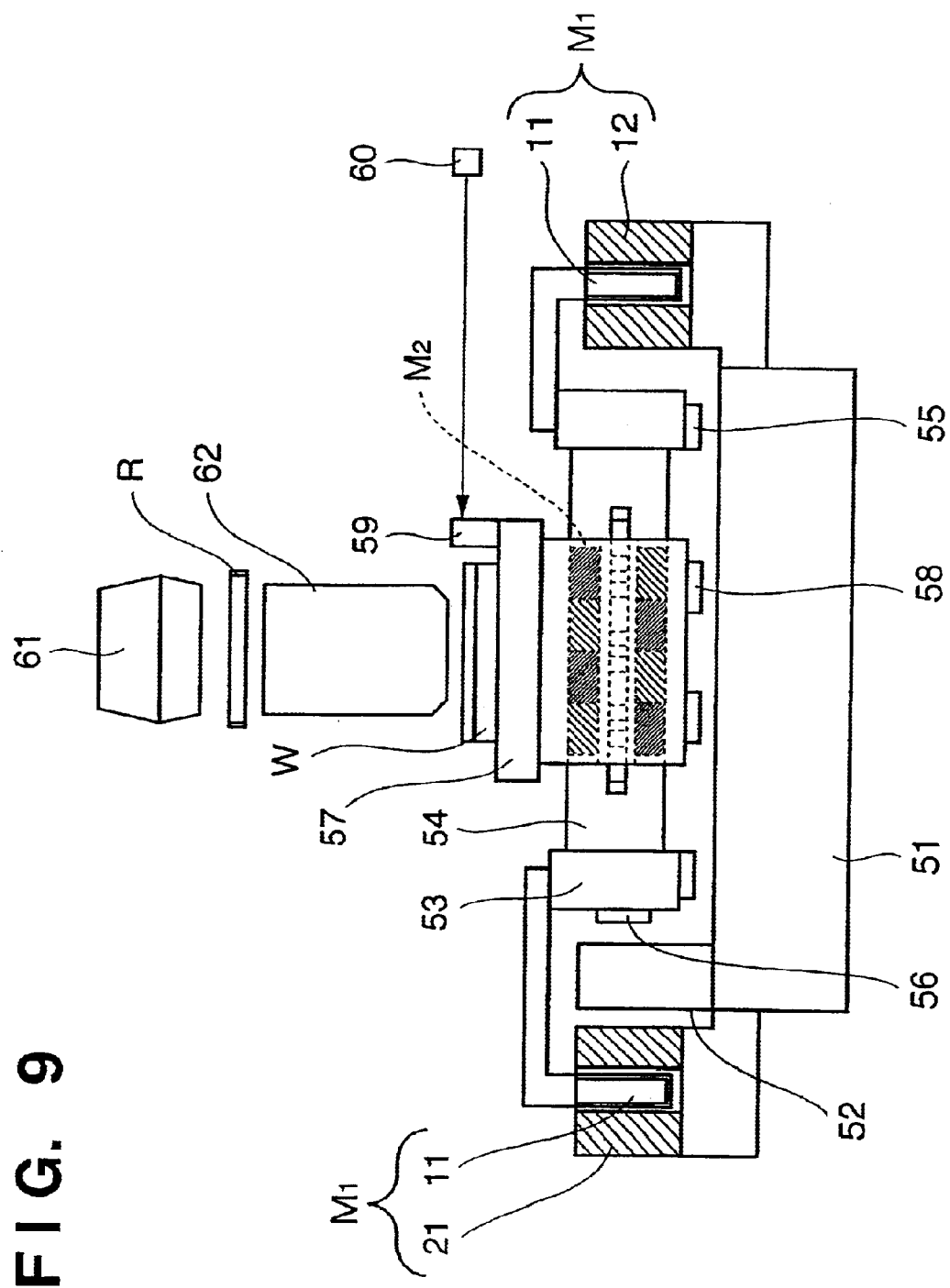
FIG. 9 is a schematic elevation showing an exposure apparatus.

FIG. 9 shows a semiconductor device manufacturing exposure apparatus having, as a wafer stage, a stage apparatus in which a linear motor M1 identical to that described above is used as the driving unit. A guide 52 and linear motor stator 21 are fixed on a surface plate 51. The linear motor stator 21 has multi-phase electromagnetic coils, and a linear motor movable element 11 has a permanent magnet group, in the same manner as described above. The linear motor movable element 11 is connected as a movable portion 53 to a movable guide 54 serving as a stage. When the linear motor M1 is driven, the movable guide 54 is moved in a direction normal to the surface of the sheet of the drawing. The movable portion 53 is supported by a static pressure bearing 55 with reference to the upper surface of the surface plate 51 and by a static pressure bearing 56 with reference to the side surface of the guide 52.

A movable stage 57 serving as a stage arranged astride the movable guide 54 is supported by a static pressure bearing 58. The movable stage 57 is driven by a linear motor M2 similar to the linear motor M1 described above. The movable stage 57 moves to the right and left on the surface of the sheet of drawing with reference to the movable guide 54. The movement of the movable stage 57 is measured by using a mirror 59 and interferometer 60 fixed to the movable stage 57.

A wafer W as a substrate is held on a chuck mounted on the movable stage 57. The circuit pattern of a reticle R as the master is reduced and transferred onto the wafer W by a light source 61 and projection optical system 62.

Figure 10:
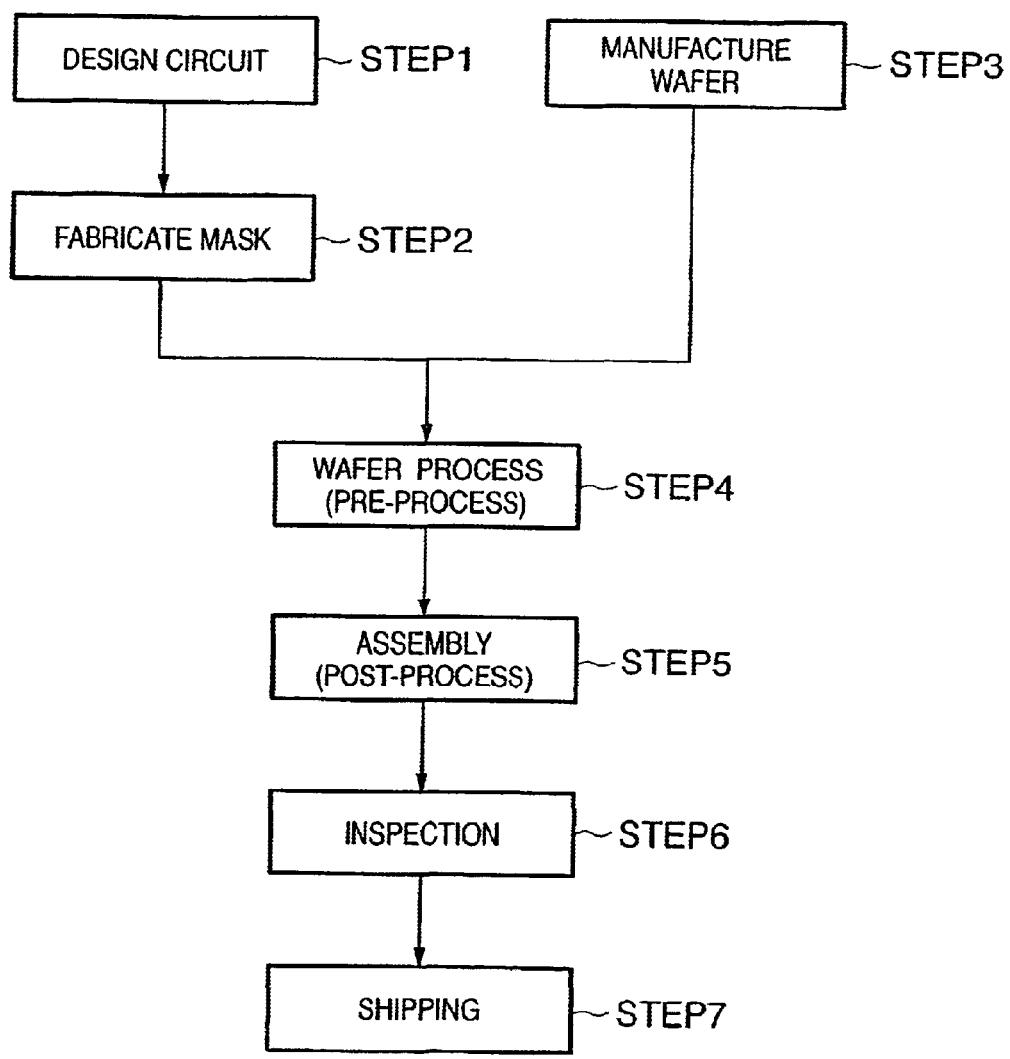
FIG. 10 is a flow chart showing a device manufacturing process.

An embodiment of a device manufacturing method conducted by the above exposure apparatus will be described. FIG. 10 shows the flow of the manufacture of a semiconductor device (e.g., a semiconductor chip such as an IC or LSI, a liquid crystal panel, a CCD, or the like). In step 1 (design circuit), a semiconductor device circuit is designed. In step 2 (fabricate mask), a mask as the master with the designed circuit pattern is fabricated. In step 3 (manufacture wafer), a wafer is manufactured by using a material such as silicon. In step 4 (wafer process) called a pre-process, an actual circuit is formed on the wafer in accordance with lithography techniques using the exposure apparatus by using the prepared mask and wafer. Step 5 (assembly) called a post-process is the step of forming a semiconductor chip by using the wafer fabricated in step 4, and includes an assembly process (dicing and bonding) and a packaging process (chip encapsulation). In step 6 (inspection), inspections such as the operation confirmation test and durability test of the semiconductor device fabricated in step 5 are conducted. After these steps, the semiconductor device is completed and shipped (step 7).

Figure 11:
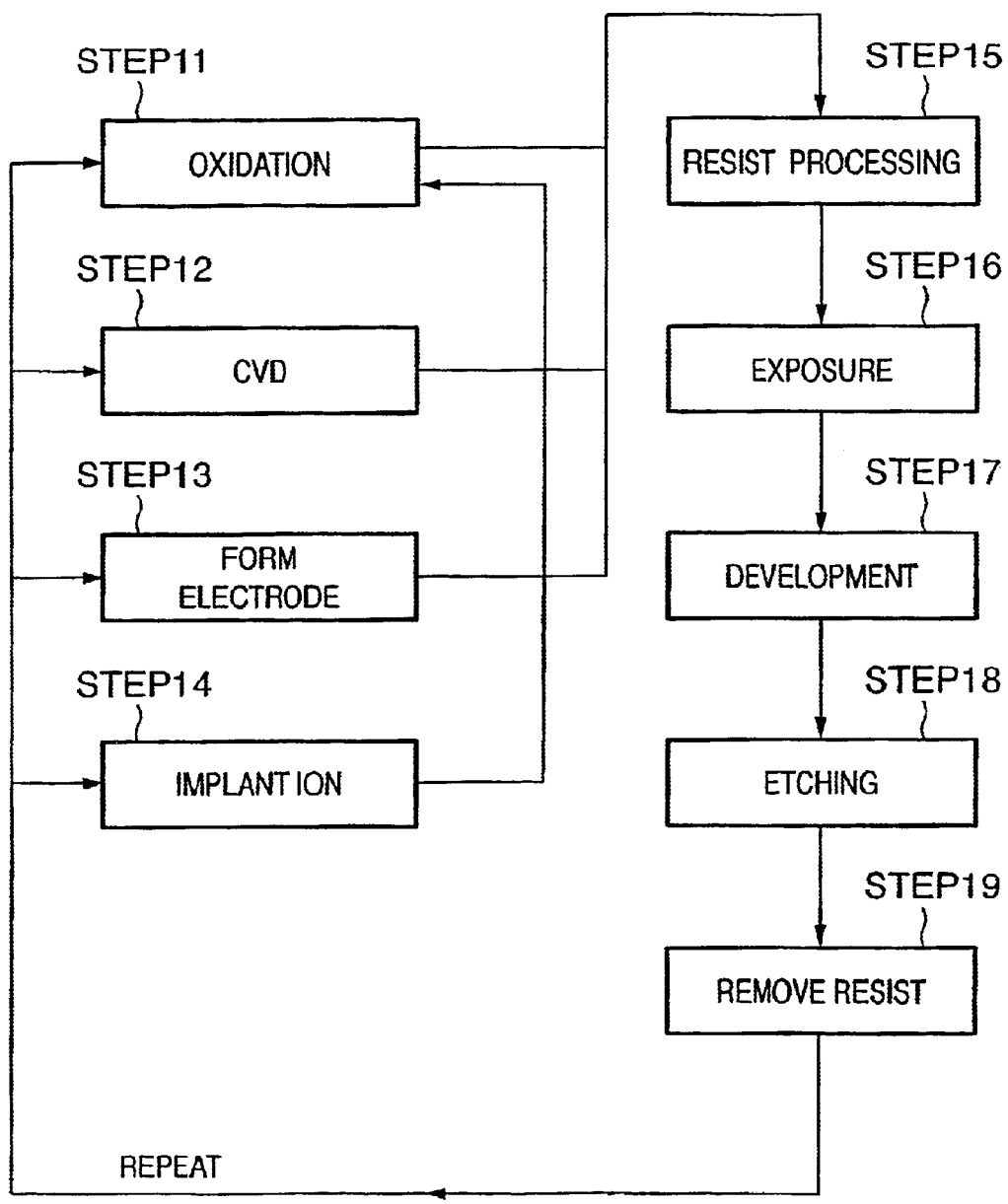
FIG. 11 is a flow chart showing a wafer process.

FIG. 11 shows the detailed flow of this wafer process. In step 11 (oxidation), the wafer surface is oxidized. In step 12 (CVD), an insulating film is formed on the wafer surface. In step 13 (form electrode), an electrode is formed on the wafer by vapor deposition. In step 14 (implant ion), ions are implanted in the wafer. In step 15 (resist processing), a photosensitive agent is applied to the wafer. In step 16 (exposure), the above-mentioned exposure apparatus exposes the wafer to the circuit pattern of the mask. In step 17 (developing), the exposed wafer is developed. In step 18 (etching), the resist is etched except for the developed resist image. In step 19 (remove resist), an unnecessary resist after etching is removed. These steps are repeated to form multiple circuit patterns on the wafer. When the manufacturing method of this embodiment is used, a high-integration semiconductor device which is conventionally difficult to manufacture can be manufactured.

As described above, according to this embodiment, a high-performance linear motor with a high driving force and a small thrust ripple can be manufactured at a low cost by using a magnetic group with a simple arrangement in which identical rectangular parallelepiped permanent magnets are arrayed adjacent to each other.

To use this linear motor in a stage apparatus such as a wafer stage can largely contribute to an improvement in transfer performance and productivity of an exposure apparatus that manufactures a semiconductor device or the like.

The present invention is not limited to the above embodiments and various changes and modifications can be made within the spirit and scope of the present invention. Therefore, to apprise the public of the scope of the present invention the following claims are made.

What is claimed is:

1. A linear motor comprising:

a first magnet group having a plurality of first magnets arrayed such that polarization directions thereof are periodically opposite, and a plurality of second magnets arrayed such that polarization directions thereof are periodically opposite and intersect those of the first magnets;

a second magnet group having a plurality of third magnets arrayed such that polarization directions thereof are periodically opposite, and a plurality of fourth magnets arrayed such that polarization directions thereof are periodically opposite and intersect those of said third magnets;

a support member which supports the first magnet group on one side and the second magnet group on the other side;

first and second electromagnetic coils disposed on both sides of the support member, wherein the first electromagnetic coil is disposed to oppose the first magnet group to generate a Lorentz force in cooperation with the first magnet group, and the second electromagnetic coil is disposed to oppose the second magnet group to generate a Lorentz force in cooperation with the second magnet group; and first and second yokes disposed on both sides of the support member, wherein the first yoke is integrated with the first electromagnetic coil and the second yoke is integrated with the second electromagnetic coil.

2. The linear motor according to claim 1, wherein one of a motor movable element and a stator has the first and second magnet group and support member, while the other has the first and second electromagnetic coils and the first and second yokes.

3. The linear motor according to claim 2, wherein the first and second yokes are not movable relative to each other.

4. The linear motor according to claim 1, wherein the polarization directions of the first and second magnets intersect with each other at an angle of substantially ninety degrees, and the polarization directions of the third and fourth magnets intersect with each other at an angle of substantially ninety degrees.

5. The linear motor according to claim 4, wherein the first, second, third and fourth magnets have rectangular parallelepiped permanent magnets.

6. The linear motor according to claim 5, wherein the first, second, third and fourth magnets are the same shape.

7. The linear motor according to claim 4, wherein the magnets located at a terminal end of the first and second magnet groups have smaller volumes than those of the remaining magnets, respectively.

8. The linear motor according to claim 7, wherein each one of the first and second magnet groups generates a sine wave magnetic field.

9. A stage apparatus comprising:

a stage;

a linear motor which drives the stage;

one of a motor movable element and a stator having (i) a first magnet group having a plurality of first magnets arrayed such that polarization directions thereof are periodically opposite, and a plurality of second magnets arrayed such that polarization directions thereof are periodically opposite and intersect those of the first magnets, and (ii) a second magnet group having a plurality of third magnets arrayed such that polarization directions thereof are periodically opposite, and a plurality of fourth magnets arrayed such that the polarization directions thereof are periodically opposite and intersect those of said third magnets, and (iii) a support member which supports the first magnet group on one side and the second magnet group on the other side; and the other of the motor movable element and the stator having (i) first and second electromagnetic coils disposed on both sides of the support member, wherein the first electromagnetic coil is disposed to oppose the first magnet group to generate a Lorentz force in cooperation with the first magnet group, and the second electromagnetic coil is disposed to oppose the second magnet group to generate a Lorentz force in cooperation with the second magnet group, and (ii) first and second yokes disposed on both sides of the support member, wherein the first yoke is integrated with the first electromagnetic coil and the second yoke is integrated with the second electromagnetic coil.

10. An exposure apparatus for exposing a pattern of a master to a substrate, said apparatus comprising:

a stage which moves at least one of the master and the substrate;

a linear motor which drives the stage;

one of a motor movable element and a stator having (i) a first magnet group having a plurality of first magnets arrayed such that polarization directions thereof are periodically opposite, and a plurality of second magnets arrayed such that polarization directions thereof are periodically opposite and intersect those of said first magnets, (ii) a second magnet group having a plurality of third magnets arrayed such that polarization directions thereof are periodically opposite, and a plurality of fourth magnets arrayed such that polarization directions thereof are periodically opposite and intersect those of said third magnets, and (iii) a support member which supports the first magnet group on one side and the second magnet group on the other side; and the other of the motor movable element and the stator having (i) first and second electromagnetic coils disposed on both sides of the support member, wherein the first electromagnetic coil is disposed to oppose the first magnet group to generate a Lorentz force in cooperation with the first magnet group, and the second electromagnetic coil is disposed to oppose the second magnet group to generate a Lorentz force in cooperation with the second magnet group; and (ii) first and second yokes disposed on both sides of the support member, wherein the first yoke is integrated with the first electromagnetic coil and the second yoke is integrated with the second electromagnetic coil.

11. A device manufacturing method comprising:

providing a master and a substrate to the exposure apparatus according to claim 10; and exposing a pattern of the master to the substrate.

* * * * *